United States Patent
Nanba et al.

(10) Patent No.: US 6,535,039 B2
(45) Date of Patent: Mar. 18, 2003

(54) LOW POWER CIRCUIT WITH PROPER SLEW RATE BY AUTOMATIC ADJUSTMENT OF BIAS CURRENT

(75) Inventors: Hiromi Nanba, Kawasaki (JP); Tohru Mizutani, Kawasaki (JP); Makoto Ikeshita, Sapporo (JP); Masato Takeyabu, Sapporo (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/921,578

(22) Filed: Aug. 6, 2001

(65) Prior Publication Data

US 2002/0063590 A1 May 30, 2002

(30) Foreign Application Priority Data

Nov. 24, 2000 (JP) ......................................... 2000-357019

(51) Int. Cl.[7] .................................................. H03K 5/12
(52) U.S. Cl. ...................... 327/170; 327/379; 327/538; 327/545; 326/33
(58) Field of Search .............................. 327/94–96, 170, 327/336, 337, 339, 345, 379–382, 398, 401, 561, 53 B, 545; 341/122, 124; 326/17, 22, 26, 30, 31, 33, 82; 323/312, 209

(56) References Cited

U.S. PATENT DOCUMENTS 5,107,224 A * 4/1992 Meyer ........................ 330/147
5,831,562 A * 11/1998 Van Auken et al. .......... 327/94
6,154,083 A * 11/2000 Gaudet et al. ................ 326/27

FOREIGN PATENT DOCUMENTS

EP WO 01/43277 A1 6/2001

* cited by examiner

Primary Examiner—Tuan T. Lam
Assistant Examiner—Minh Nguyen
(74) Attorney, Agent, or Firm—Arent Fox Kintner Plotkin & Kahn, PLLC (57) ABSTRACT

An evaluation circuit 16 repeats processing in which an output VD thereof is reset, there is obtained repeatedly given times a difference between sampled output voltages Vo of a replica circuit 11R when respective times t1 and t2 have elapsed after a voltage Vi is step-inputted to the replica circuit 11R, and the differences are successively summed. A comparator circuit 20 compares a difference cumulation voltage VD with a reference voltage VS. A bias adjustment circuit 15 steps up the bias currents of the replica circuit 11R and an adjusted circuit 11 at every this given times if VD>VS, and ceases the adjustment if VD<VS.

20 Claims, 12 Drawing Sheets

LOW POWER CIRCUIT WITH PROPER SLEW RATE BY AUTOMATIC ADJUSTMENT OF BIAS CURRENT

BACKGROUND OF THE INVENTION

1. Field of the Invention

The present invention relates to a semiconductor integrated circuit including an adjusted circuit a slew rate (an amount of change in output voltage per unit time for step input) of whose output is dependent on a bias current and a circuit automatically adjusting the value of the bias current to achieve low power with proper slew rate.

2. Description of the Related Art

Figure 9:
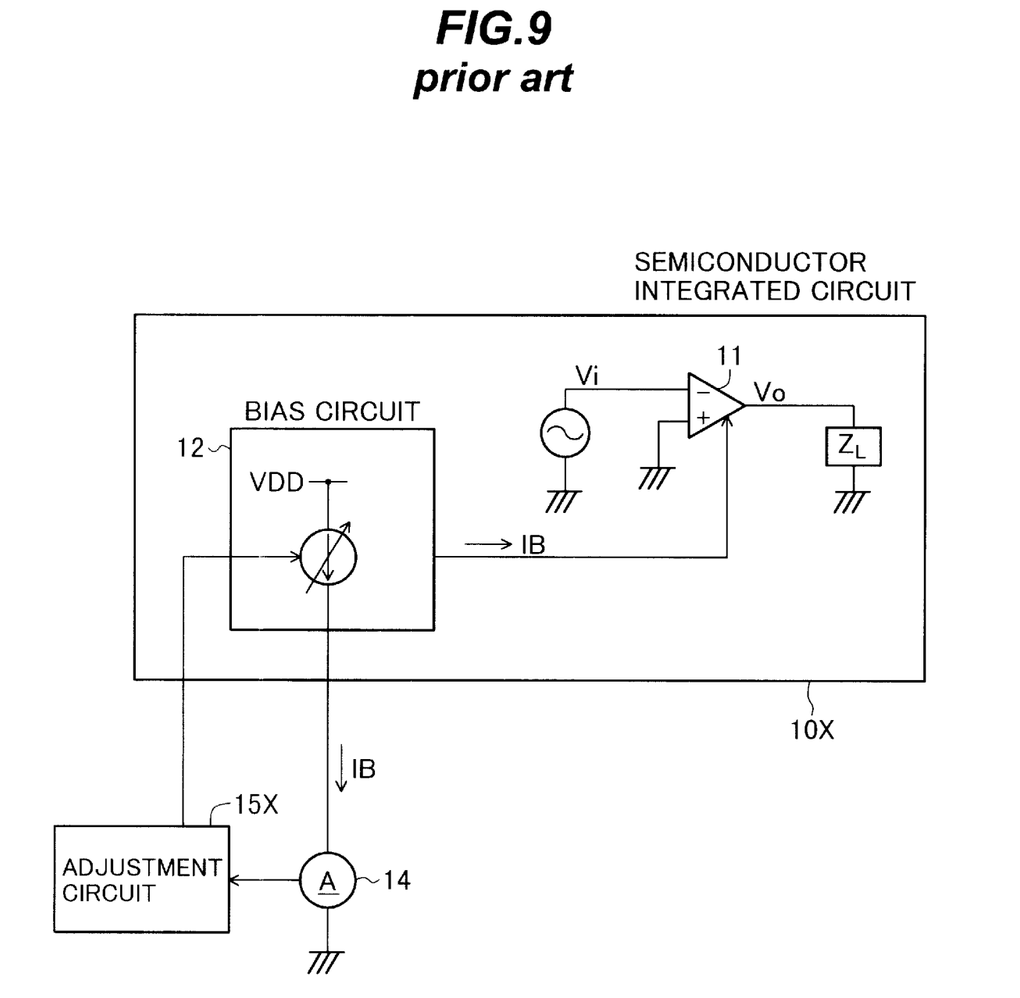
FIG. 9 is an illustration of bias adjustment to a prior art semiconductor integrated circuit including an adjusted circuit whose slew rate is dependent on a bias current.

FIG. 9 is an illustration of bias adjustment to a prior art semiconductor integrated circuit 10X including an adjusted circuit 11 whose slew rate is dependent on a bias current IB.

To the adjusted circuit 11, the bias current IB is provided from a bias circuit 12. The output of the adjusted circuit 11 is connected to another circuit not shown or an output terminal of the semiconductor integrated circuit 10X and a load impedance measured at the output of the adjusted circuit 11 is $Z_L$.

Figure 10:
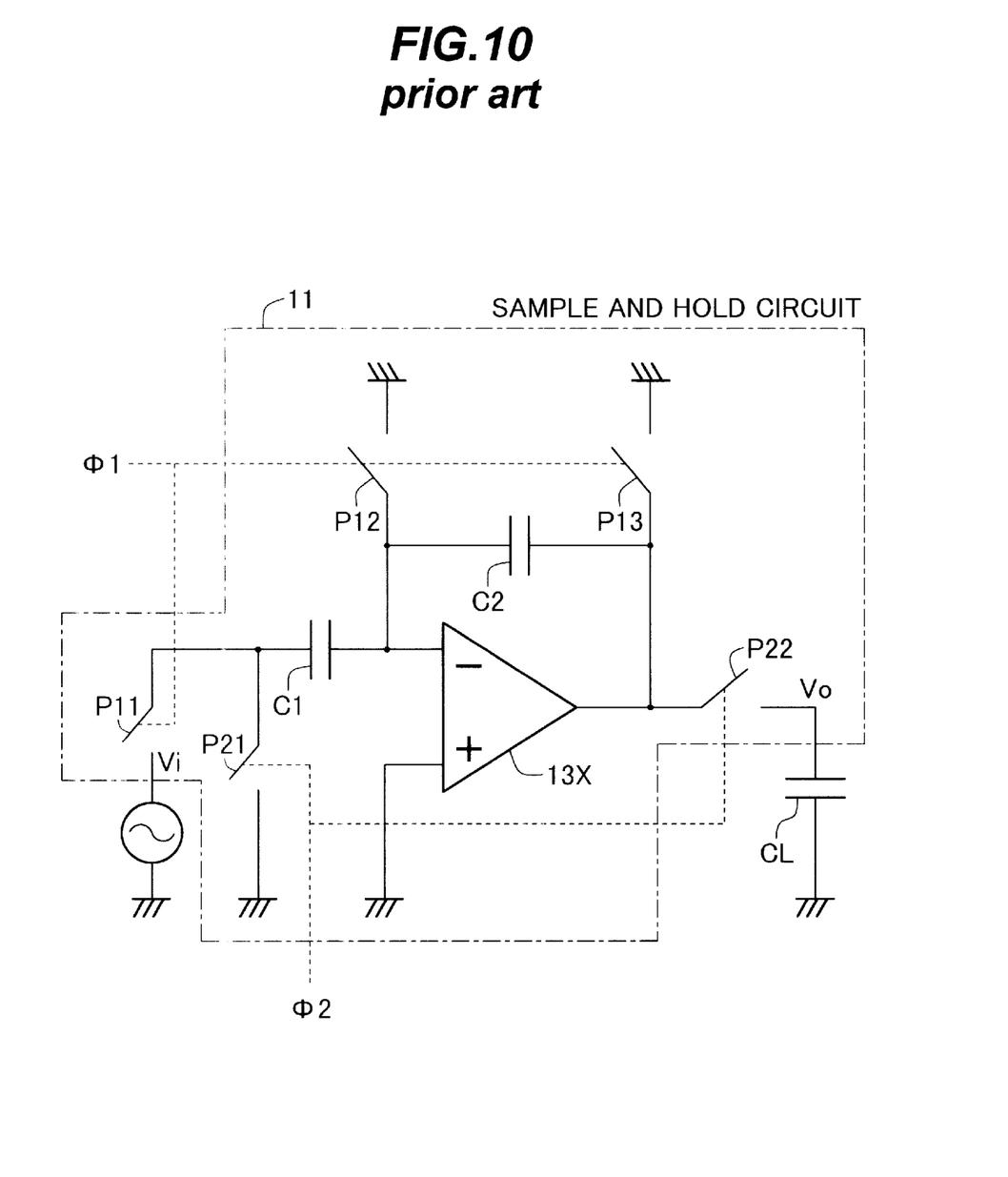
FIG. 10 is a diagram showing a sample and hold circuit as an adjusted circuit of FIG. 9, which is a combination of a switched capacitor circuit and an operational amplifier.
Figure 11:
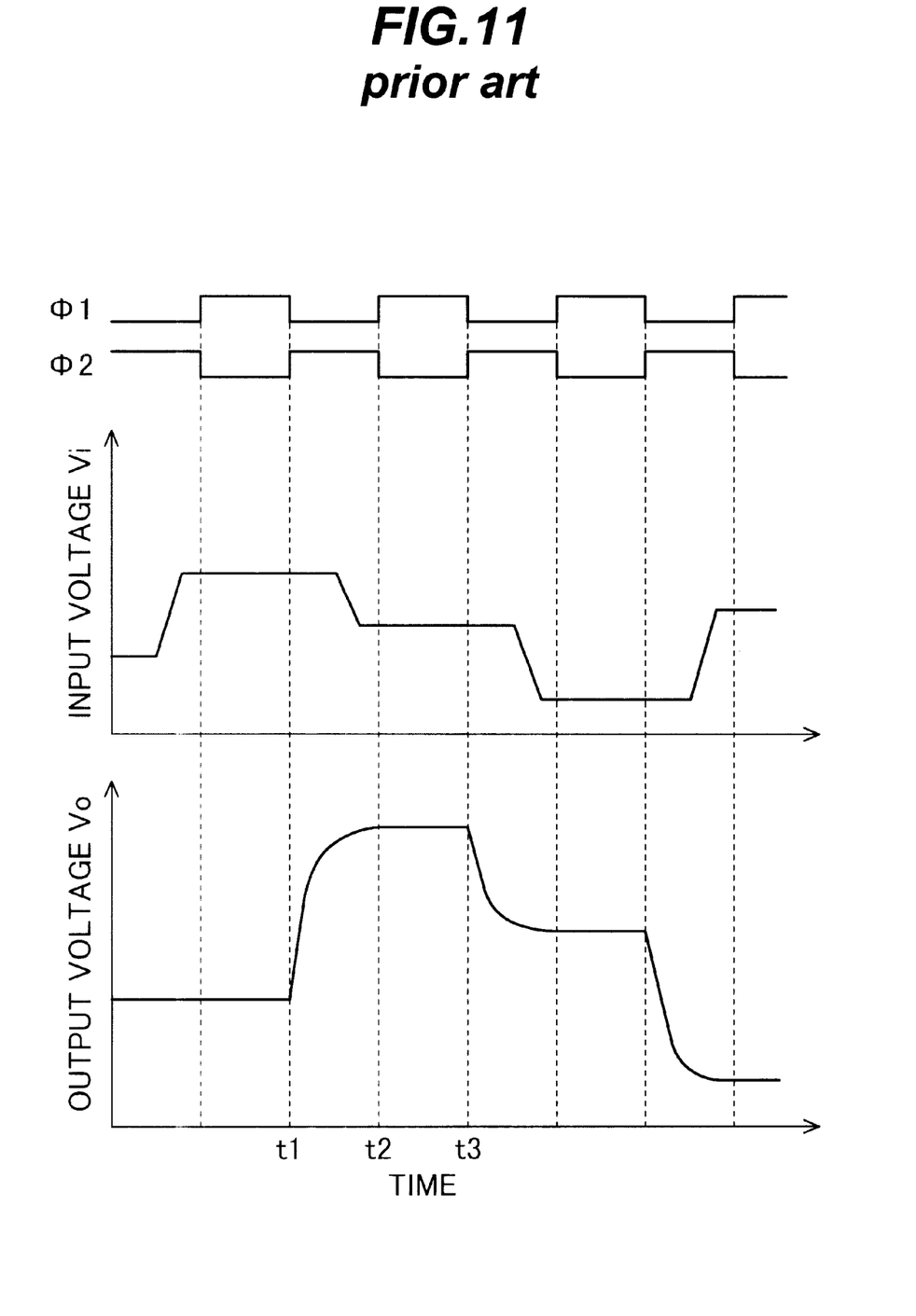
FIG. 11 are waveform diagrams showing operation of the circuit of FIG. 10.

FIG. 10 shows a sample and hold circuit as an adjusted circuit 11 of FIG. 9, which is a combination of a switched capacitor circuit and an operational amplifier 13X. FIG. 10 shows a case where the load impedance can be approximated by a capacitance CL. FIG. 11 are waveform diagrams showing operation of the circuit of FIG. 10.

The switches of FIG. 10 are controlled by two phase clocks $\phi 1$ and $\phi 2$ shown in FIG. 11, wherein a high and a low of each clock correspond to ON and OFF of switches controlled by the clock. The switches P11, P12 and P13 are is controlled by the clock $\phi 1$ and switches P21 and P22 are controlled by the clock $\phi 2$.

The input and output voltages of the adjusted circuit 11 are denoted by Vi and Vo, respectively. When the clock $\phi 1$ is high, the both ends of a integrating capacitor C2 are grounded to be reset and a sampling capacitor C1 is simultaneously charged with the input voltage Vi. The electric charge Q1 charged on the sampling capacitor C1 is C1×Vi. Then, when the clock $\phi 2$ goes high, the electric charge Q1 is transferred to the integrating capacitor C2 and if a sufficient settling time is given, the electric charge Q2 of the integrating capacitor C2 becomes C2×Vo. Since Q1=Q2, a relation Vo=(C1/C2)Vi holds.

When the adjusted circuit 11 is operated with a high speed clock signal, unless the adjusted circuit 11 has a sufficient drive ability for the load capacitance CL, the slew rate is insufficient and Vo<(C1/C2)Vi, whereby a necessary output amplitude will not be obtained.

In design, the bias current IB to be provided to the operational amplifier 13X is determined such that a necessary slew rate can be obtained under the worst conditions of a power supply voltage, temperature and a deviation in circuit element characteristics occurring in fabrication process. Besides, there are taken into consideration a variation in drive ability of the operational amplifier 13X in company with a variation in the bias current IB and a variation in the capacitance CL.

In ordinary case, however, the worst conditions does not occur, thereby resulting in excessive power consumption.

Figure 12:
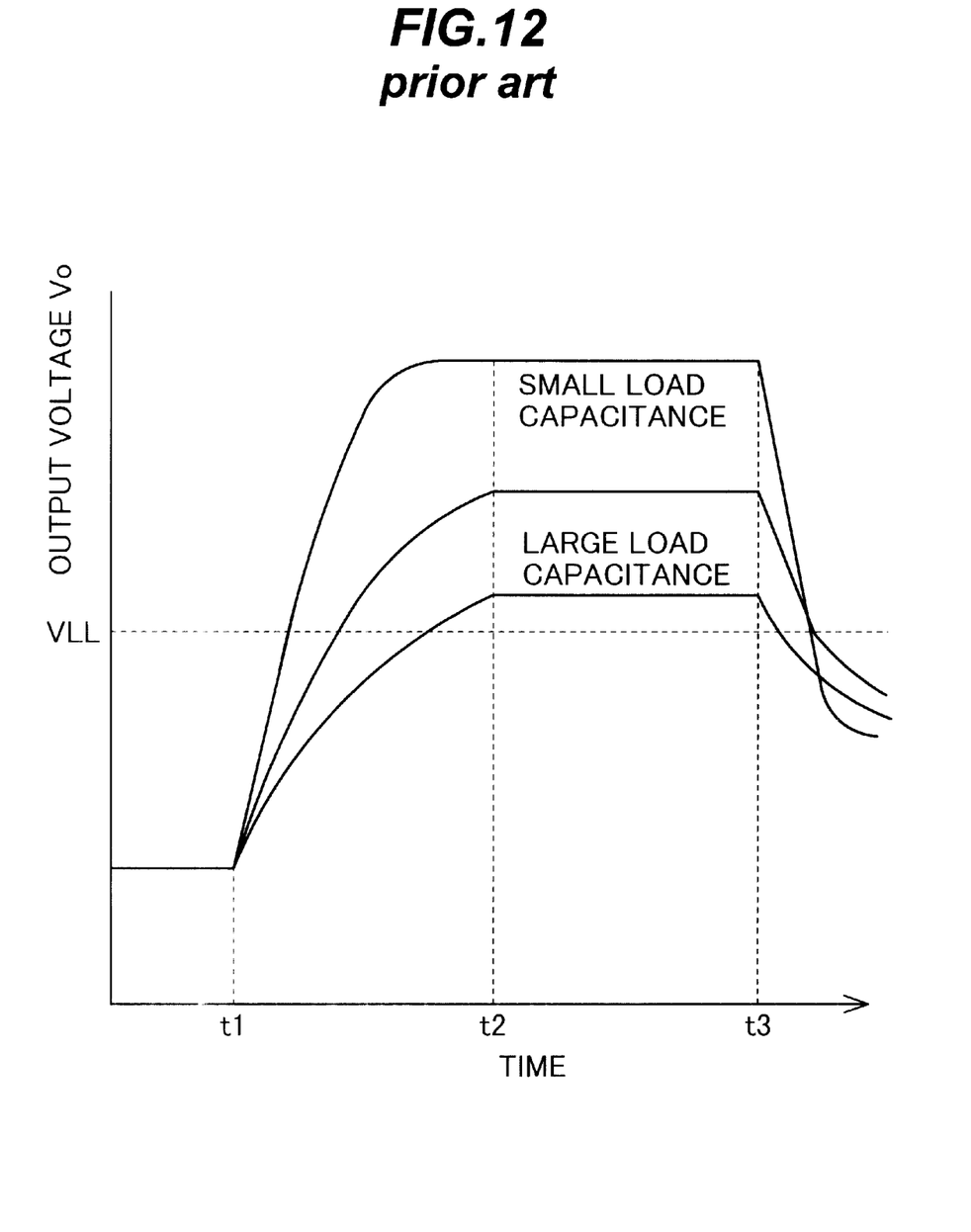
FIG. 12 is a waveform diagram of output voltages Vo, with respect to time between t1 and t3 of FIG. 11, of adjusted circuits under different conditions fabricated on the basis of the same design.

FIG. 12 shows the output voltages Vo, with respect to time between t1 and t3 of FIG. 11, of adjusted circuits 11 under different conditions fabricated on the basis of the same design. In FIG. 12, VLL denotes the lowest limit value of a necessary output voltage Vo for ensuring a normal operation of the adjusted circuits 11 under the worst conditions.

Referring back to FIG. 9, in order to solve the problem of excessive power consumption, a configuration was adopted in the prior art in which a bias circuit 12 capable of adjusting the bias current IB is incorporated in the semiconductor integrated circuit 10X, a bias current IB having the same value as the bias current IB provided to the adjusted circuit 11 is taken out from the bias circuit 12 to the outside and measured with an ammeter 14, and such a trimming adjustment is performed that the bias current IB is adjusted by an adjustment circuit 15X to make the bias current IB within a given range. This adjustment is performed in the final stage of a fabrication process of the semiconductor integrated circuit 10X.

However, since characteristic variations in load impedance and a variation in load impedance caused by variations in power supply voltage and temperature are not taken into consideration, the bias current BI has to be determined assuming that the load impedance has the maximum value, leading to insufficient reduction in power consumption. Further, since adjustment operation for the bias current IB is necessary in fabrication process of the semiconductor integrated circuit 10X, the cost increases.

SUMMARY OF THE INVENTION

Accordingly, it is an object of the present invention to provide a semiconductor integrated circuit capable of achieving more of power consumption of a circuit, whose slew rate is dependent on a bias current, without adjusting the bias current thereof prior to product shipment.

In one aspect of the present invention, there is provided a semiconductor integrated circuit comprising: a replica circuit of an adjusted circuit whose slew rate is dependent on a bias current; and a bias current automatic adjustment circuit; wherein the replica circuit is repeatedly operated for adjustment. This automatic adjustment circuit comprises: an evaluation circuit; a comparator circuit; and a bias adjustment circuit.

In the evaluation circuit, processing is repeated, wherein the processing includes: resetting an output thereof; obtaining a difference between first and second values of an output of the replica circuit given times, the first and second value being respective ones at respective times when first and second time intervals has elapsed after a given value having been step-inputted to the replica circuit; and successively summing the differences. In the comparator circuit, a value obtained by the successively summing is compared with a reference value. The bias adjustment circuit changes the bias currents of the replica circuit and the adjusted circuit according to a comparison result of the comparator circuit at every given times.

According to this semiconductor integrated circuit, since even if there are variations in bias current and output load of adjusted circuit due to variations in fabrication process, power supply and environmental temperature, the bias current is automatically and properly adjusted coping with the variations, and low power consumption can be realized. Further, a parasitic capacitance of circuit elements of the automatic adjustment circuit exerts no adverse influence on a main signal system including the adjusted circuit, and in addition automatic adjustment of the bias current of the adjusted circuit can be performed without ceasing operation of the main signal system in parallel thereto. Still further, there is no need to perform bias current adjustment operation at the final stage of fabrication of the semiconductor integrated circuit, thereby enabling reduction in cost thereof.

Other aspects, objects, and the advantages of the present invention will become apparent from the following detailed description taken in connection with the accompanying drawings.

DESCRIPTION OF THE PREFERRED EMBODIMENTS

Referring now to the drawings, wherein like reference characters designate like or corresponding parts throughout several views, preferred embodiments of the present invention are described below.

First Embodiment

Figure 1:
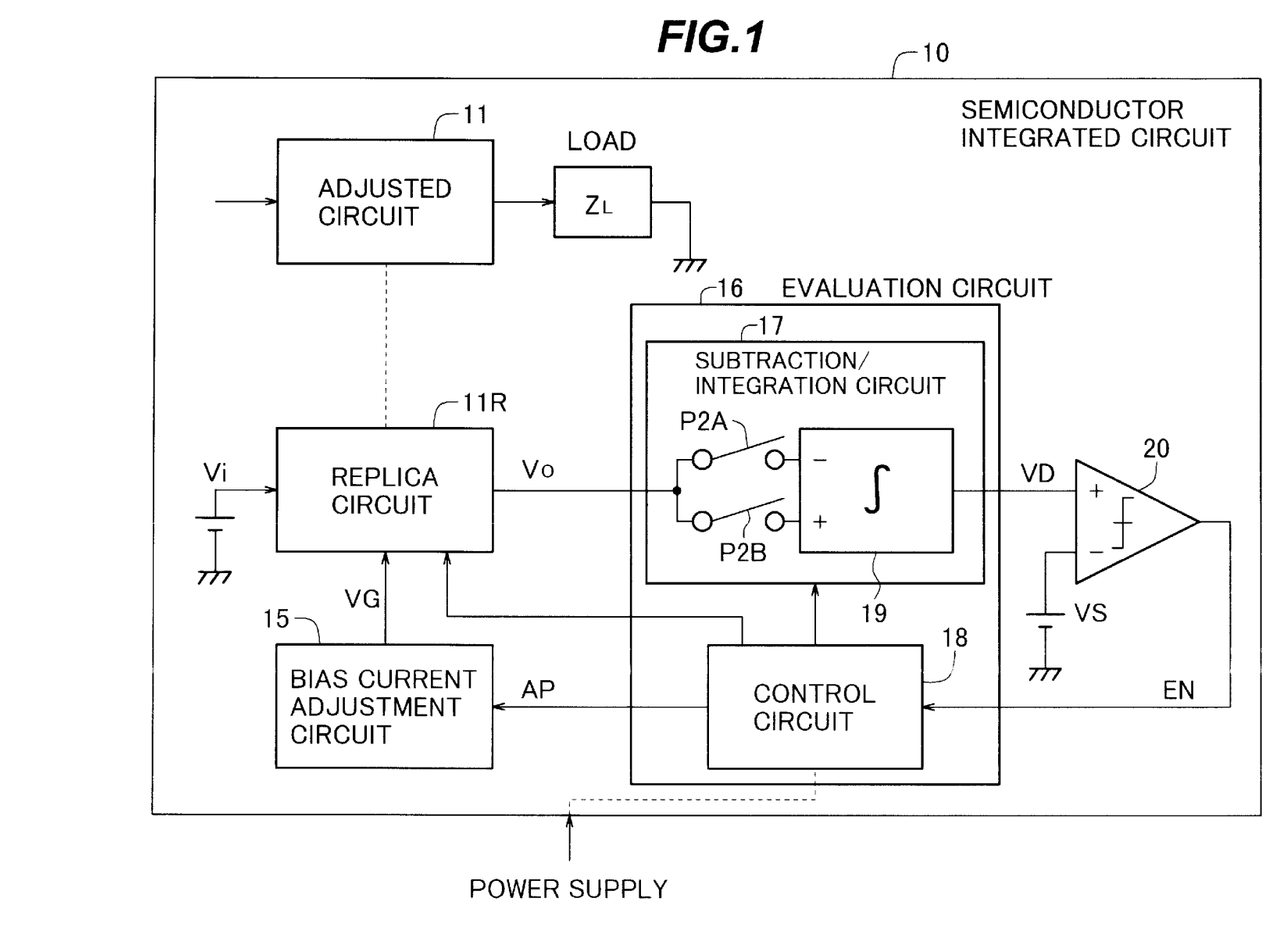
FIG. 1 is a block diagram of a semiconductor integrated circuit including an adjusted circuit whose slew rate is dependent on a bias current and a bias current automatic adjustment circuit, of one embodiment according to the present invention.

FIG. 1 is a block diagram of a semiconductor integrated circuit 10 including an adjusted circuit 11 whose slew rate is dependent on a bias current and a bias current automatic adjustment circuit.

The output of the adjusted circuit 11 is connected to another circuit not shown or an output terminal of the semiconductor integrated circuit 10, and a load impedance measured at the output of the adjusted circuit 11 is $Z_L$. In the semiconductor integrated circuit 10, there is formed a replica circuit 11R which is substantially the same as the adjusted circuit 11. In order to increase the degree of the sameness as the adjusted circuit 11, the replica circuit 11R is formed in the proximity of the adjusted circuit 11. Bias currents with the same value flow through the adjusted circuit 11 and the replica circuit 11R, respectively, and their current value can be adjusted by a bias current adjustment circuit 15. An evaluation circuit 16 connected to the output of the replica circuit 11R is designed such that a load impedance measured at the output of the replica circuit 11R is almost equal to that of the adjusted circuit 11.

The evaluation circuit 16 is provided with a subtraction/integration circuit 17 and a control circuit 18, and the subtraction/integration circuit 17 is provided with switches P2A and P2B and an integration circuit 19.

The switch P2A is connected between the output of the replica circuit 11R and the inverting input of the integration circuit 19, and the switch P2B is connected between the output of the replica circuit 11R and the non-inverting input of the integration circuit 19. The integration circuit 19 has the inverting input and non-inverting input, and successively sums up values each proportional to a difference between a signal provided to the non-inverting input and a signal provided to the inverting input to output the sum as a difference cumulation voltage VD. The reason for the successive summing is to increase precision of bias current adjustment. That is, an individual difference is extremely small, which makes direct comparative evaluation within an allowable error difficult, and therefore the cumulation of the differences is adopted.

The difference cumulation voltage VD is provided to the inverting input of a comparator 20 and a reference voltage VS is provided to the non-inverting input thereof. An enable signal EN outputted from the comparator 20 is high when VD>VS while being low when VD<VS.

The control circuit 18 provides a timing signal to the replica circuit 11R and the subtraction/integration circuit 17 to operate the circuits cyclically as will be described later, and if the enable signal EN is high, that is VD>VS, after the subtraction/integration circuit 17 repeats an operation N times, then the control circuit 18 provides a pulse of an adjustment signal AP to a bias current adjustment circuit 15. The bias current adjustment circuit 15 responds to this pulse and adjusts, by one step, the bias current of the replica circuit 11R and adjusted circuit 11 in a direction in which the value of the bias current converges to the optimal value.

Figure 2:
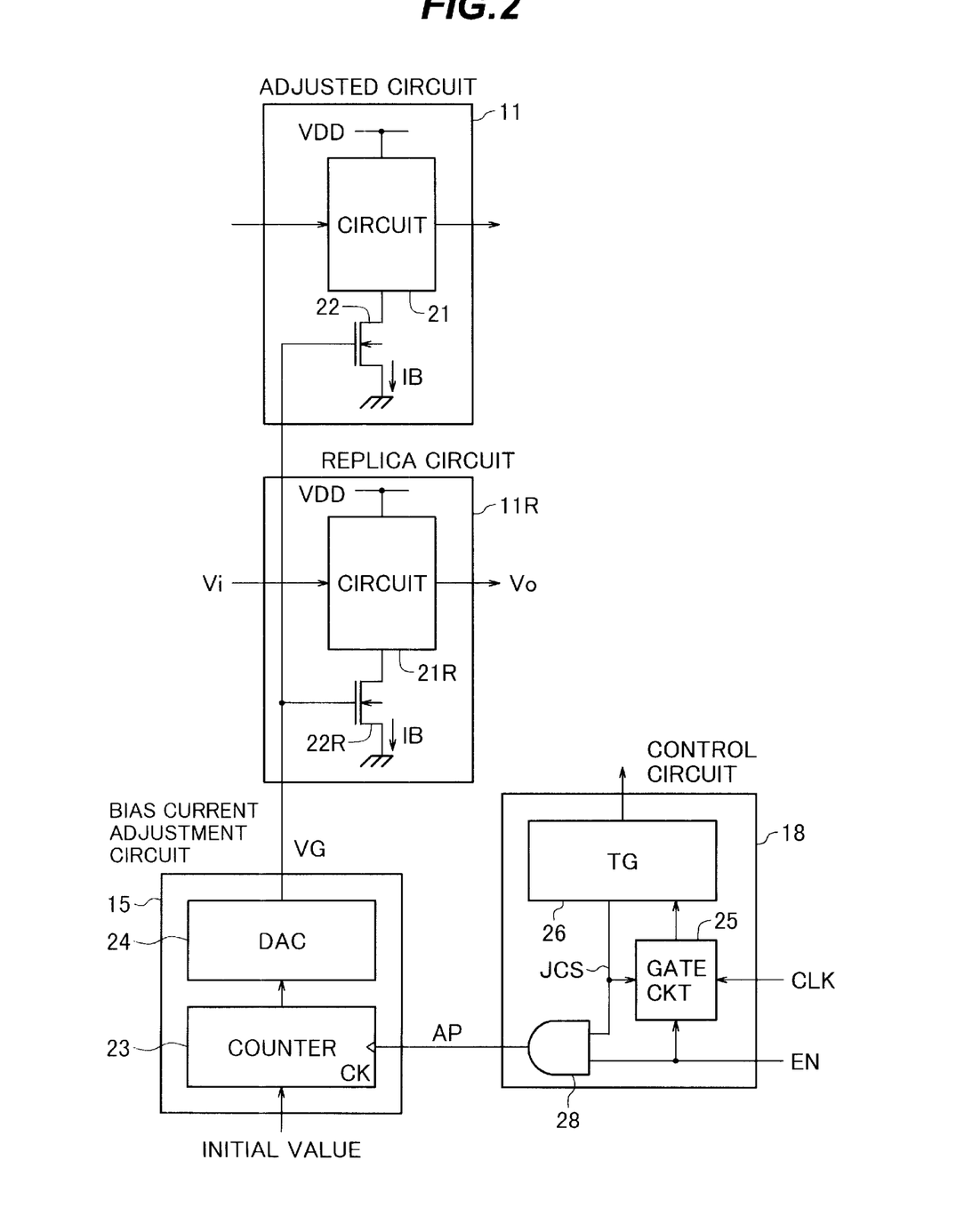
FIG. 2 is a block diagram showing a structural example of part of FIG. 1.

FIG. 2 is a block diagram showing a structural example of part of FIG. 1.

In the adjusted circuit 11, a circuit 21 and FET 22 are connected in series between a power supply potential VDD and ground. A circuit 21R and an FET 22R of the replica circuit 11R correspond to a circuit 21 and an FET 22, respectively, of the adjusted circuit 11.

The bias current adjustment circuit 15 is provided with a counter 23 and a D/A converter 24 to which the count of the counter 23 is provided, and the output of the D/A converter 24 is provided to the gates of the FETs 22 and 22R as a gate voltage VG. Into the FETs 22 and 22R, a bias current IB according to the value of the gate voltage VG flows. As the gate voltage VG rises, the bias current IB increases with the result of a higher slew rate of the circuits 21 and 21R.

In the control circuit 18, a clock CLK is provided though a gate circuit 25 to a timing generation circuit 26. The timing generation circuit 26 generates a timing signal for the replica circuit 11R and the subtraction/integration circuit 17 on the bases of the clock CLK. The timing generation circuit 26 further generates a judgment cycle signal JCS whose pulse cycle is equal to a comparative judgment cycle (a cycle of judging as K=N at the step S7 of FIG. 3), and provides it to one input of an AND gate 28. The enable signal EN is provided to the other input of the AND gate 28, and while the enable signal EN is high, pulses of the judgment cycle signal JCS are provided through the AND gate 28 to the clock input CK of the counter 23 as an adjustment signal AP. After power is turned on, the gate circuit 25 enters into a through state for the clock CLK and this-state is latched at a flip-flop thereof. When the enable signal EN is low at a rise of a pulse of the judgment cycle signal JCS, then the flip-flop is reset to enter into a cutoff state for the clock CLK, and operation of the control circuit 18 ceases, that is, a bias current automatic adjustment operation has been completed.

Figure 3:
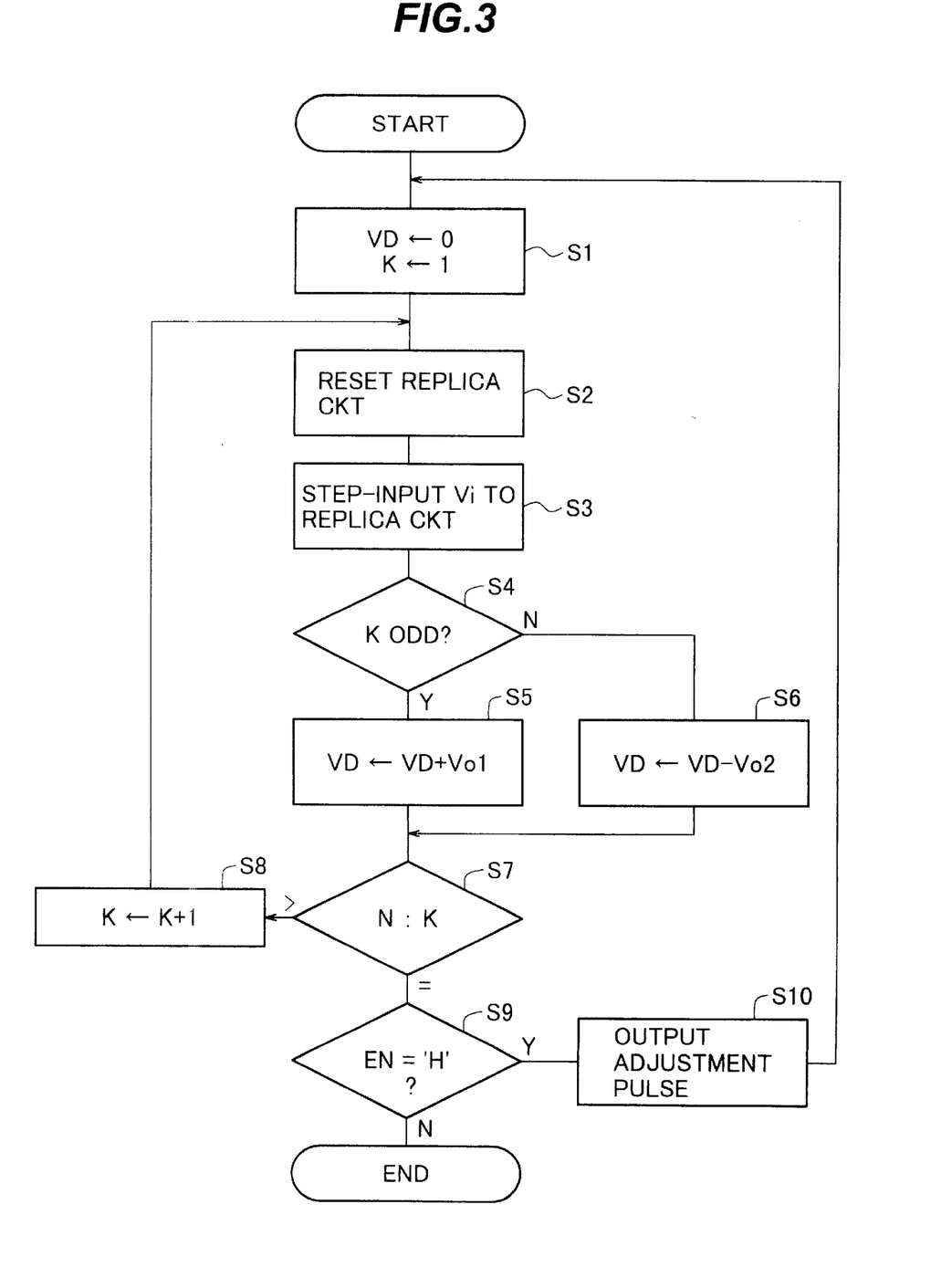
FIG. 3 is a flow chart showing a control sequence of the control circuit of FIG. 1.
Figure 4A:
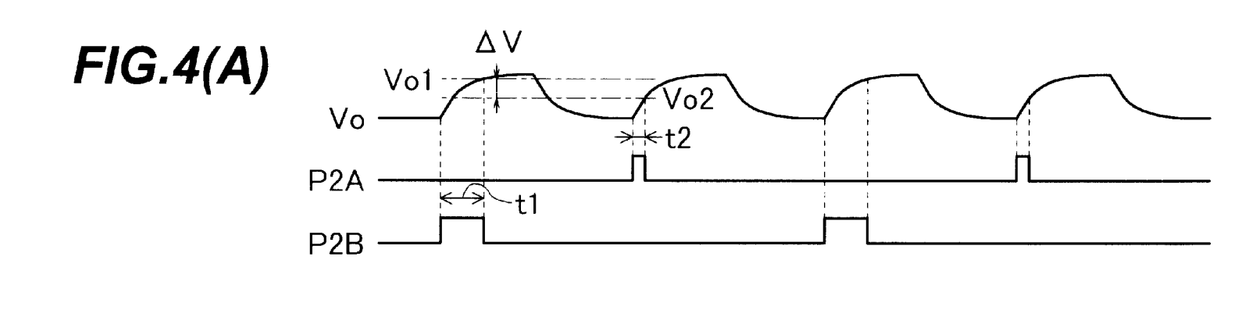
FIGS. 4(A) to 4(C) are diagrams each showing a waveform of an output voltage Vo and on/off waveforms of switches P2A and P2B of FIG. 1.
Figure 4B:
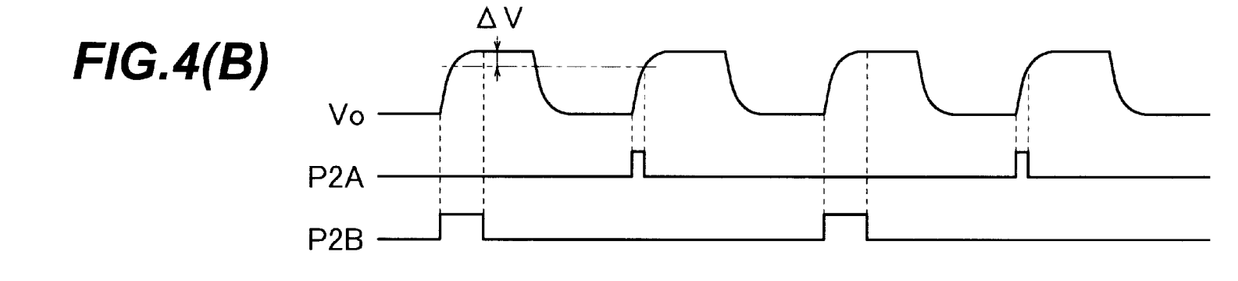
Figure 4C:
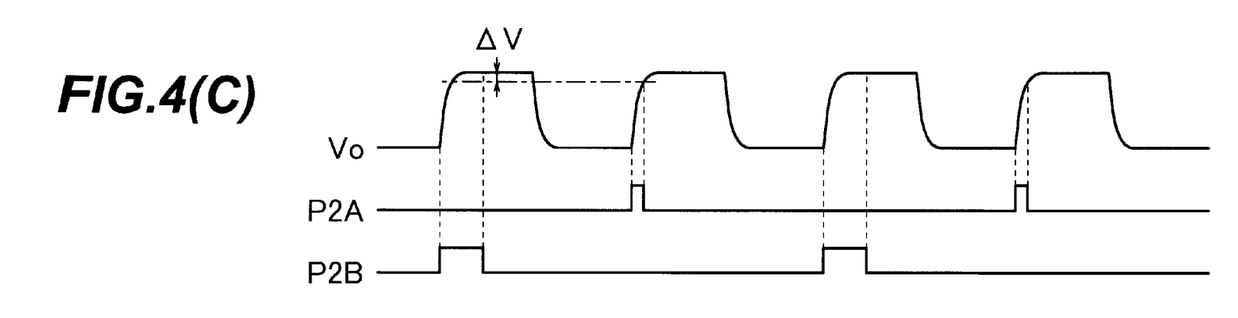

FIG. 3 is a flow chart showing a control sequence of the control circuit 18 of FIG. 1. FIGS. 4(A) to 4(C) each show waveforms of the output voltage Vo and on/off waveforms of the switches P2A and P2B of FIG. 1. In the following description, characters in parenthesis denotes step identification in FIG. 3.

(S1) The integration circuit 19 is caused to reset, and thereby its output VD becomes 0 V. Further, an internal counter K is caused to load an initial value of 1 and the counter 23 of FIG. 2 is caused to load an initial value.

(S2) The replica circuit 11R is caused to reset, and thereby its output voltage Vo becomes 0 V.

(S3) The replica circuit 11R is caused to receive an input voltage stepping up to Vi. Thereby, the output voltage Vo rises as shown in FIG. 4(A) for example.

(S4) If the counter K indicates an odd number, then the process goes to step 5, or else the process goes to step S6.

(S5) The switch P2B is caused to keep an ON state as shown in FIG. 4(A) till a time t1 elapses after the input voltage of the replica circuit 11R being stepped up to Vi, and the integration circuit 19 is caused to add a value Vo1 of the output voltage Vo to the VD when the switch P2B transits from ON to OFF. Thereafter, the process goes to step S7.

(S6) The switch P2A is caused to keep an ON state as shown in FIG. 4(A) till a time t2 elapses after the input voltage of the replica circuit 11R being stepped up to Vi, and the integration circuit 19 is caused to subtract a value Vo2 of the output voltage Vo from the VD when the switch P2A transits from ON to OFF.

(S7) If N>K, then the process goes to step S8, and if N=K, then the process goes to step 9.

(S8) The value of the counter K is incremented by 1, and the process returns to step S2.

Each time the processing of steps S1 to S8 has been repeated twice, ΔV=Vo1−Vo2 is added to VD. In general, a value proportional to a voltage difference ΔV is added to VD.

(S9) The judgment cycle signal JCS of FIG. 2 rises, and at this time if the enable signal EN is high ('H'), that is, VD>VS, then the process goes to step S10, or else the clock CLK is not provided to the timing generation circuit 26 in FIG. 2 to cease operation of the control circuit 18. In the latter case, no pulse of the adjustment signal AP is provided to the counter 23 to fix the output of the counter 23, and therefore both the gate voltage VG and the bias current IB are also fixed. Thereby, automatic adjustment of the bias current is completed.

(S10) In FIG. 2, a pulse of the judgment cycle signal JCS passes through the AND gate 28 and is provided to the clock input CLK of the counter 23 as a pulse of the adjustment signal AP. Then, the process returns to step Si.

When values of the gate voltage VG corresponding to the waveforms of the output voltage Vo of FIGS. 4(A) to 4(C) are denoted by VG1, VG2 and VG3, respectively, a relation VG1<VG2<VG3 holds. That is, the value of the bias current IB is larger in the case of FIG. 4(B) than in the case of FIG. 4(B), and the value of the bias current IB is larger in the case of FIG. 4(C) than in the case of FIG. 4(B). As the value of the bias current IB is larger, the rise time of the output voltage Vo is shorter and the voltage difference ΔV is smaller, and therefore the value VD obtained by cumulating ΔVo over N times is also smaller. Since power consumption increases with decrease in the value of VD, a proper value of VD at which excessive power consumption can be prevented and the adjusted circuit 11 normally operates is obtained in advance, which is adopted as a reference voltage VS.

Figure 5A:
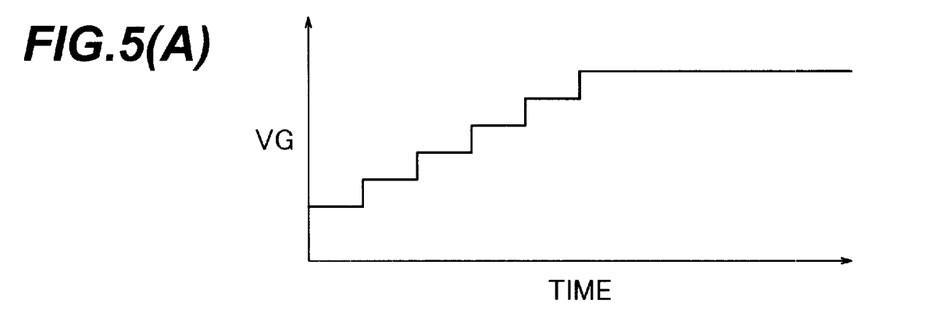
FIGS. 5(A) to 5(C) are graphs showing changes over time in output value of the bias current adjustment circuit when automatically adjusting a bias current by step-up, step-down and dichotomizing search methods, respectively.

The gate voltage VG changes stepwise as shown in FIG. 5(A) in response to pulses of the adjustment signal AP.

Since according to the present embodiment, the bias current automatic adjustment circuit as described above is provided to the adjusted circuit 11 in the semiconductor integrated circuit 10, the bias current of the adjusted circuit 11 is properly and automatically adjusted in response to variations in the bias current and the output load of the adjusted circuit 11 occurring by variations in fabrication process, power supply voltage and environmental temperature, which enables realization of low power consumption. Furthermore, since no necessity arises of bias current adjustment at the final stage of fabrication process of the semiconductor integrated circuit 10, it is possible to reduce cost. Moreover, since the replica circuit 11R is provided corresponding to the adjusted circuit 11 and automatic adjustment is performed using the output thereof, the parasitic capacitance of circuit elements of the automatic adjustment circuit exerts no adverse influence on a main signal system, and in addition automatic adjustment of the bias current of the adjusted circuit 11 can be performed without ceasing operation of the main signal system in parallel thereto.

Figure 5B:
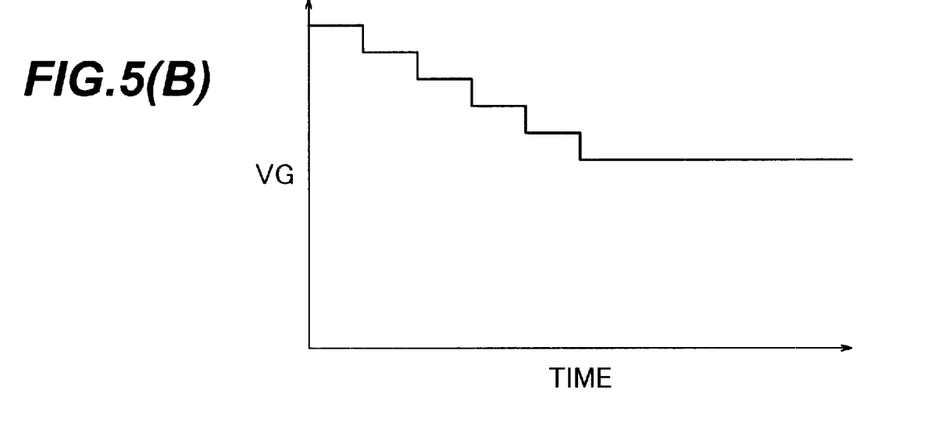
Figure 5C:
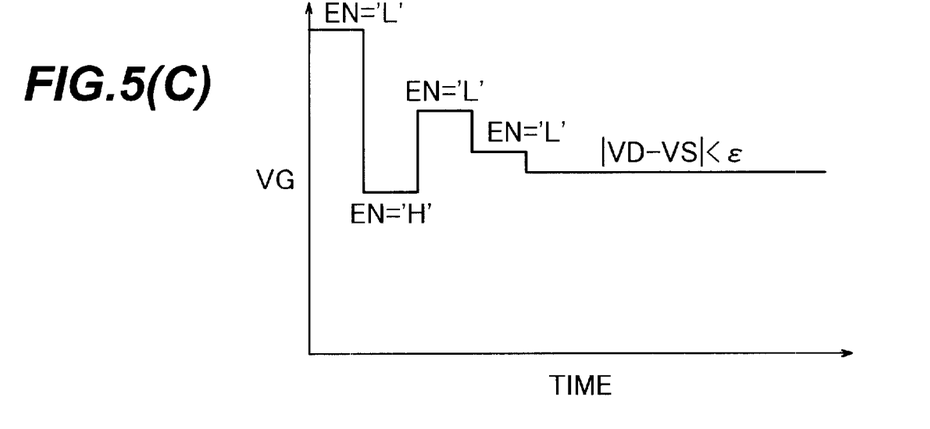

Note that other methods may be adopted in order to converge the bias current IB. For example, the counter 23 may be replaced with a down counter, and the reference voltage VS and the difference cumulation voltage VD are provided to the non-inverting input and inverting input, respectively, of the comparator 20 of FIG. 1. In this case, the gate voltage VG changes as shown in FIG. 5(B). Further, the counter 23 and the AND gate 28 of FIG. 2 may not be employed with using a dichotomizing search method in which the gate voltage VG is changed as shown in FIG. 5(C) depending on the sign of the enable signal EN each time a pulse of the adjustment cycle signal JCS is provided and this processing is repeated till the absolute value of the difference between the difference cumulation voltage VD and the reference voltage VS becomes less than a given value ϵ.

Figure 6:
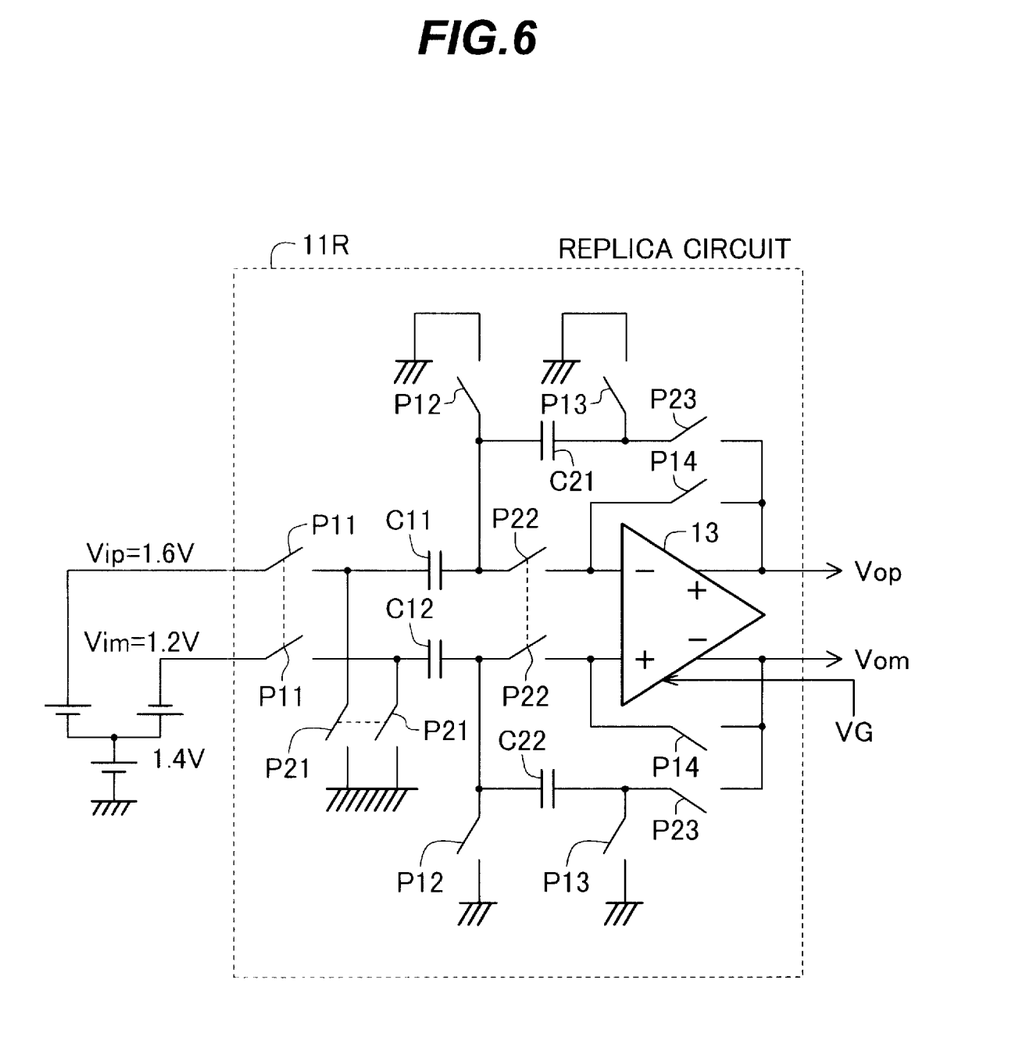
FIG. 6 is a diagram showing a structural example of the replica circuit of FIG. 1.
Figure 7:
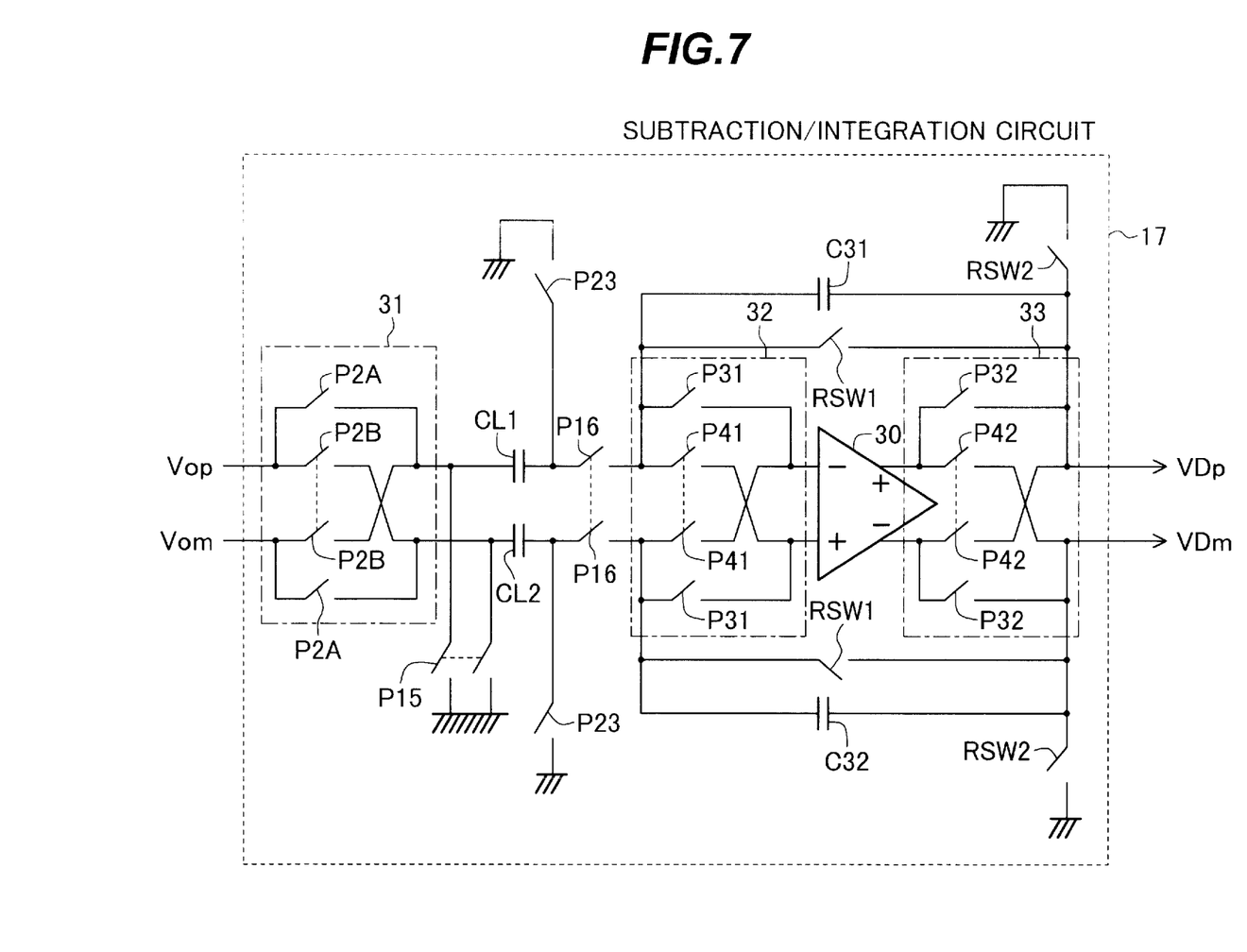
FIG. 7 is a diagram showing a structural example of the subtraction/integration circuit of FIG. 1.
Figure 8:
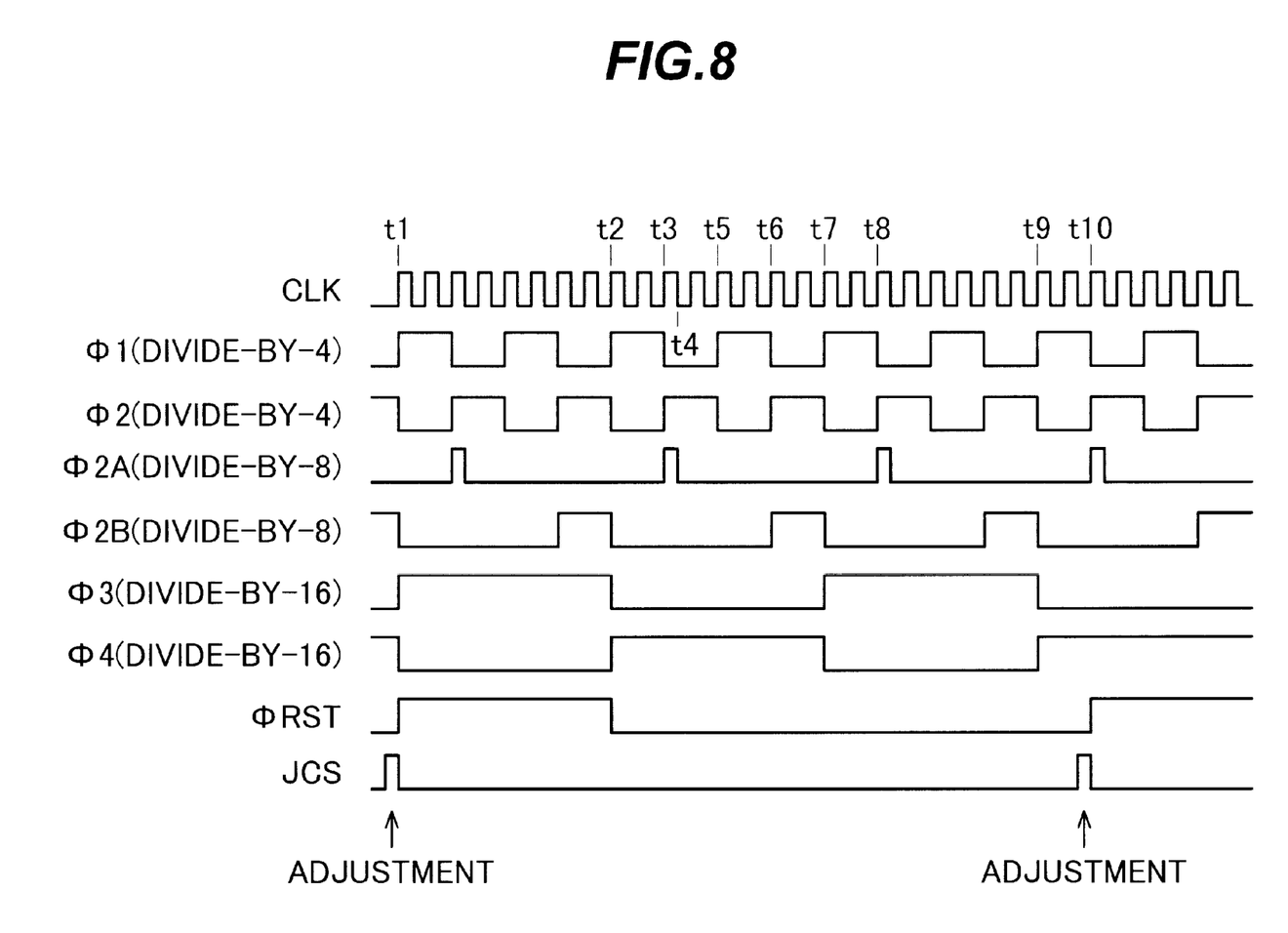
FIG. 8 is a timing chart showing a reference clock CLK, control signals provided to the switches of FIGS. 6 and 7 and a judgment cycle signal JCS of FIG. 2.

FIGS. 6 and 7 respectively show structural examples of the replica circuit 11R and the subtraction/integration circuit 17 of FIG. 1. These circuits are of a complementary input/output type. FIG. 8 shows the clock CLK, control signals provided to the circuits of FIGS. 6 and 7 and the judgment cycle signal JCS of FIG. 2. FIG. 8 shows a case where the value N of FIG. 3 is 4.

The replica circuit 11R is a sample and hold circuit which is a combination of a switched capacitor circuit and a complementary input/output operational amplifier 13, and analogous to the adjusted circuit 11 of FIG. 10. Switches of FIG. 6 are denoted by the same reference characters as those of the corresponding switches of FIG. 10. In the circuit of FIG. 6, there are provided switches P14 and P23 which are not provided in the circuit of FIG. 10.

The switches P14 are for short-circuiting between the inverting input and the non-inverting output and between the non-inverting input and the inverting output of the operational amplifier 13 to let the complementary input/output of the operational amplifier 13 be of the same potential, for example, 1.4 V, and the offset thereof be 0 V when resetting the replica circuit 11R. The switches P22 and P23 are for separating the inputs and outputs of the operational amplifier 13 from integrating capacitors C21 and C22 to enable to reset the integrating capacitors C21 and C22 to the ground potential with switches P12 and P13 being on, which is different from the same input and output potential of the operational amplifier 13 when resetting the replica circuit 11R.

The switches P11 to P14 are subjected to on/off control by a clock $\phi 1$ of FIG. 8 obtained by dividing the frequency of the clock CLK by 4, and these switches are turned on when the clock $\phi 1$ is high. The switches P21 and P23 are subjected to on/off control by a clock $\phi 2$ in opposite phase from the clock $\phi 1$, and these switches are turned on when the clock $\phi 2$ is high. Sampling capacitors C11 and C12 are of the same capacitance and correspond to the sampling capacitor C1 of FIG. 10. The integrating capacitors C21 and C22 are of the same capacitance and correspond to the integrating capacitor C2 of FIG. 10.

To the replica circuit 1R, for example, Vip=1.6 V and Vim=1.2 V as complementary input signals are provided.

Since operation of the circuit of FIG. 6 can be understood with ease from operation of FIG. 10 described above, description thereof is omitted.

The subtraction/integration circuit 17 of FIG. 7 is analogous to the replica circuit 11R of FIG. 6. A complementary input/output operational amplifier 30, a polarity changeover circuit 31, switches P15, sampling capacitors CL1, CL2, integrating capacitors C31 and C32, and a polarity changeover circuit 32 correspond to the operational amplifier 30, the switches P11 and P21, the capacitors C11, C12, C21 and C22, and the switches P22, respectively, of FIG. 6. The polarity changeover circuit 31 in which the switches P2A and P2B are connected in parallel and cross connection enables addition/subtraction on electric charges. The sampling capacitors CL1 and CL2 or the sampling capacitors CL2 and CL1 are charged with the output voltages Vop and Vom, respectively, in a state where the switch P23 is on and the switches P15 and P16 is off, and next the electric charges are transferred to the integrating capacitors C31 and C32, whereby addition or subtraction are performed on cumulated electric charges on the integrating capacitors C31 and C32.

Capacitances of the sampling capacitors CL1 and CL2 are determined such that a load impedance measured at the output of the circuit of FIG. 6 is almost equal to the load impedance ZL of FIG. 1.

The electric charges of the sampling capacitors CL1 and CL2 are transferred to the integrating capacitors C31 and C32 by turning off the switch P23 and turning on the switches P15 and P16 in a state where the polarity changeover circuits 32 and 33 are in parallel or cross connection.

The polarity changeover circuits 32 and 33 are for canceling offset voltages with each other. That is, a polarity of an offset voltage added to the integrating capacitors C31 and C32 when electric charges on the sampling capacitors CL1 and CL2 are transferred to the respective integrating capacitors C31 and C32 with the polarity changeover circuits 32 and 32 in parallel connection is opposite from a polarity of an offset voltage added to the integrating capacitors C31 and C32 when electric charges on the sampling capacitors CL1 and CL2 are transferred to the respective integrating capacitors C31 and C32 with the polarity changeover circuits 32 and 33 in cross connection, and therefore the offset voltages are canceled with each other.

Reset switches RSW1 and RSW2 are for resetting electric charges on the integrating capacitors C31 and C32.

The switches P2A and P2B are controlled by the respective clocks $\phi 2A$ and $\phi 2B$ of FIG. 8. The switches P15 and P16 are controlled by the clock $\phi 1$ of FIG. 8 together with the switches P11 to P14 of FIG. 6. The switch P23 are controlled by the clock $\phi 2$ of FIG. 8 together with the switches P21 to P23 of FIG. 6. Switches P31 and P32 are controlled by a clock $\phi 3$ of FIG. 8. Switches P41 and P42 are controlled by a clock $\phi 4$ of FIG. 8. The reset switches RSW1 and RSW2 are controlled by a clock $\phi RST$ of FIG. 8. A high and a low of switch control clocks of FIG. 8 correspond to ON and OFF, respectively, of the switches controlled by the corresponding clocks.

The voltage difference between the complementary output voltages VDp and VDm corresponds to the difference cumulation voltage VD of FIG. 1, and is compared with the reference voltage VS at the comparator 20 (FIG. 1).

Next, description will be given of operation of the circuit of FIG. 7 with reference to FIG. 8.

(t1 to t2) The reset switches RSW1 and RSW2 are on and the subtraction/integration circuit 17 is reset, that is, electric charges on the integrating capacitors C31 and C32 are reset.

(t2 to t9) The reset switches RSW1 and RSW2 are off. In a time interval between t2 and t7, the switches P41 and P42 are on and the switches P31 and P32 are off, while in the next time interval between t7 and t9, the converse arises.

Details in the time interval between t2 and t7 are as follows:

(t3 to t4) The switches P2A are on, the switches P2B are off, the switches P15 and P16 are off, and the switches P23 are on, and thereby the sampling capacitors CL1 and CL2 are charged with the respective output voltages Vop and Vom. At t4, the switches P2A are turned off, and the output voltages Vop and Vom at this time are held on the sampling capacitors CL1 and CL2.

(t5 to t6) The switches P23 are off, the switches P15 and P16 are on, and thereby electric charges on the sampling capacitors CL1 and CL2 are transferred to the respective integrating capacitors C31 and C32.

(t6 to t7) The switches P2A are off, the switch P2B are on, the switches P15 and P16 are off, the switches P23 are on, and thereby the sampling capacitors CL1 and CL2 are charged with the respective output voltages Vom and Vop. At t7, the switches P2B are turned off, and the output voltages Vom and Vop at this time are held on the respective sampling capacitors CL1 and CL2.

Details in a time interval between t7 and t10 are as follows:

(t7 to t8) The switches P23 are off, the switches P15 and P16 are on, and thereby electric charges on the sampling capacitors CL1 and CL2 are transferred to the respective integrating capacitors C31 and C32.

In a time interval from t8 to t10, operations similar to those in the time from t3 to t8 are performed. Immediately prior to resetting of the integrating capacitors C31 and C32 at t10, a pulse of the judgment cycle signal JCS is outputted from the timing generation circuit 26 of FIG. 2.

By such operation, the operation described with reference to FIG. 1 are performed.

Although a preferred embodiments of the present invention has been described, it is to be understood that the invention is not limited thereto and that various changes and modifications may be made without departing from the spirit and scope of the invention.

For example, bias current automatic adjustment may be performed not only when power is turned on, but also at every predetermined intervals, when the system is reset, or when temperature or a power supply voltage falls outside a given range. Further, the adjusted circuit 11 may be any one as far as the slew rate thereof is dependent on its bias current.

What is claimed is:

1. A semiconductor integrated circuit comprising:
   an adjusted circuit in which a first bias current flows, a slew rate of said adjusted circuit being dependent on said first bias current:
   a replica circuit of said adjusted circuit in which a second bias current flows, a value of said second bias current being substantially equal to that of said first bias current;
   an evaluation circuit configured to repeat a cycle of processing, said cycle of processing including:
      resetting an output thereof;
      obtaining a difference between first and second voltages at given times, said first voltage being one at an output of said replica circuit at a time when a first time interval has elapsed after a given voltage having been step-inputted to said replica circuit, said second value being one at said output of said replica circuit at a time when a second time interval has elapsed after a voltage equal to said given voltage having been step-inputted to said replica circuit, said second time interval being different from said first time interval; and
      successively summing said differences;
   a comparator circuit for comparing a value obtained by said successively summing with a reference value; and
   a bias adjustment circuit for changing said second bias current according to a comparison result of said comparator circuit at every said given times.

2. The semiconductor integrated circuit of claim 1, wherein said evaluation circuit comprises:
   a subtraction/integration circuit integrating, as said successively summing, each difference between said first voltage and said second voltage; and
   a control circuit;
   wherein said control circuit is configured to repeat the steps of:
      (1) resetting said subtraction/integration circuit;
      (2) repeating part of said cycle of processing at said given times, said part of said cycle of processing including:
         resetting said replica circuit;
         next step-inputting said given voltage to said replica circuit;
         next providing said first voltage to said subtraction/integration circuit after or till said first time interval has elapsed from said step-inputting;
         next resetting said replica circuit;
         next step-inputting said voltage equal to said given voltage to said replica circuit; and
         next providing said second voltage to said subtraction/integration circuit after or till said second time interval has elapsed from said previous step-inputting.

3. The semiconductor integrated circuit of claim 2,
   wherein said bias adjustment circuit is configured to step up said second bias current in response to judgment that a value obtained by said successively summing is larger than said reference value by said comparator circuit,
   wherein said control circuit is configured to cease operation of said bias adjustment circuit in response to judgment that said value obtained by said successively summing is smaller than said reference value.

4. The semiconductor integrated circuit of claim 3, wherein said replica circuit has an inverting output and a non-inverting output, wherein said subtraction/integration circuit comprises:
   an operational amplifier circuit having an inverting input, a non-inverting input, an inverting output and a non-inverting output;
   a first integrating capacitor connected between said inverting input and non-inverting output of said operational amplifier circuit;
   a second integrating capacitor connected between said non-inverting input and inverting output of said operational amplifier circuit;
   a reset switching circuit for resetting electric charges on said first and second integrating capacitors;
   first and second sampling capacitors; and
   a switching circuit for selectively charging said first and second sampling capacitors or said second and first sampling capacitors by said inverting output and non-inverting output, respectively, of said replica circuit, and thereafter transferring electric charges on said first and second sampling capacitors to said first and second integrating capacitors, respectively.

5. The semiconductor integrated circuit of claim 4, wherein said subtraction/integration circuit further comprises:
   a first polarity changeover circuit for connecting first ends of said first and second integrating capacitors to respective said inverting and non-inverting inputs of said operational amplifier circuit to change into a parallel connection state, or connecting said first ends of said first and second integrating capacitors to respective said non-inverting and inverting inputs of said operational amplifier circuit to change into a cross connection state, selectively; and
   a second polarity changeover circuit for connecting second ends of said first and second integrating capacitors to respective said non-inverting and inverting outputs of said operational amplifier circuit to change into a parallel connection state, or connecting said second ends of said first and second integrating capacitors to respective said inverting and non-inverting inputs of said operational amplifier circuit to change into a cross connection state, selectively.

6. The semiconductor integrated circuit of claim 5, wherein said control circuit alternately repeats a first period for causing both said first and second polarity changeover circuits to be in said parallel connection state and a second period for causing both said first and second polarity changeover circuits to be in said cross connection state, and performs said processing in said step (2) once in each of said first and second periods.

7. The semiconductor integrated circuit of claim 6, wherein said adjusted circuit comprises an operational amplifier circuit.

8. The semiconductor integrated circuit of claim 1, wherein said adjusted circuit comprises an operational amplifier circuit.

9. The semiconductor integrated circuit of claim 8, wherein said adjusted circuit further comprises a switched capacitor circuit connected to an input stage of said operational amplifier circuit.

10. The semiconductor integrated circuit of claim 2,
wherein said bias adjustment circuit is configured to step down said second bias current in response to judgment that a value obtained by said successively summing is smaller than said reference value by said comparator circuit, and
wherein said control circuit is configured to cease operation of said bias adjustment circuit in response to judgment that said value obtained by said successively summing is larger than said reference value.

11. The semiconductor integrated circuit of claim 10, wherein said adjusted circuit comprises an operational amplifier circuit.

12. The semiconductor integrated circuit of claim 11, wherein said adjusted circuit further comprises a switched capacitor circuit connected to an input stage of said operational amplifier circuit.

13. The semiconductor integrated circuit of claim 2,
wherein said bias adjustment circuit is configured to step down said second bias current in response to judgment that a value obtained by said successively summing is smaller than said reference value by said comparator circuit, and step up said second bias current in response to judgment that said value obtained by said successively summing is larger than said reference value by said comparator circuit,
wherein said control circuit is configured to cease operation of said bias adjustment circuit in a case where an absolute value of a difference between said value obtained by said successively summing and said reference value is smaller than a given value.

14. The semiconductor integrated circuit of claim 13, wherein said adjusted circuit comprises an operational amplifier circuit.

15. The semiconductor integrated circuit of claim 2, wherein said adjusted circuit comprises an operational amplifier circuit.

16. The semiconductor integrated circuit of claim 15, wherein said adjusted circuit further comprises a switched capacitor circuit connected to an input stage of said operational amplifier circuit.

17. The semiconductor integrated circuit of claim 3, wherein said adjusted circuit comprises an operational amplifier circuit.

18. The semiconductor integrated circuit of claim 17, wherein said adjusted circuit further comprises a switched capacitor circuit connected to an input stage of said operational amplifier circuit.

19. The semiconductor integrated circuit of claim 4, wherein said adjusted circuit comprises an operational amplifier circuit.

20. The semiconductor integrated circuit of claim 5, wherein said adjusted circuit comprises an operational amplifier circuit.

* * * * *